United States Patent [19]

Shimbo

[11] 4,442,448
[45] Apr. 10, 1984

[54] LOGIC INTEGRATED CIRCUIT DEVICE

[75] Inventor: Masafumi Shimbo, Tokyo, Japan

[73] Assignee: Seiko Instruments & Electronics Ltd., Tokyo, Japan

[21] Appl. No.: 199,268

[22] Filed: Oct. 21, 1980

[30] Foreign Application Priority Data

Oct. 26, 1979 [JP] Japan .................. 54-138557

[51] Int. Cl.³ .................. H01L 27/04; H03K 19/091; H03K 19/094
[52] U.S. Cl. ..................... 357/42; 307/446; 307/477; 357/22; 357/23; 357/43; 357/92; 357/59
[58] Field of Search ............ 357/57, 59, 92, 43, 357/42, 23 TF; 307/446, 477

[56] References Cited

U.S. PATENT DOCUMENTS

| 4,259,681 | 3/1981 | Nishizawa | 357/92 |
| 4,274,891 | 6/1981 | Silvestri et al. | 357/59 |
| 4,317,127 | 2/1982 | Nishizawa | 357/43 |
| 4,326,213 | 4/1982 | Shirai et al. | 357/59 |
| 4,338,618 | 7/1982 | Nishizawa | 357/92 |
| 4,352,997 | 10/1982 | Raymond, Jr. et al. | 357/59 |

FOREIGN PATENT DOCUMENTS

| 2,503,864 | 8/1976 | Fed. Rep. of Germany | 357/23 TF |
| 54-97384 | 8/1978 | Japan | 357/59 |
| 54-114186 | 9/1979 | Japan | 357/59 |

OTHER PUBLICATIONS

Davies et al., IEEE J of Solid State Circuits, vol. 5c 12, No. 4, Aug. 1977, pp. 367-375.

Primary Examiner—William D. Larkins
Attorney, Agent, or Firm—Robert E. Burns; Emmanuel J. Lobato; Bruce L. Adams

[57] ABSTRACT

An integrated logic circuit uses thin film IGFET loads integrated with complementary vertical JFET drivers, the IGFETs and JFETs being connected together gate to gate as the input and drain to drain as the effective output node.

1 Claim, 25 Drawing Figures

LOGIC INTEGRATED CIRCUIT DEVICE

BACKGROUND OF THE INVENTION

The present invention relates to a logic integrated circuit device, and more particularly a static induction transistor logic integrated circuit (SITL) which has low consumption power, and a fabricating method thereof.

An injection type SITL composed of a lateral bipolar transistor used as a load element (injector) and a vertical static induction transistor (SIT) used as a driving transistor, has an excellent characteristic, that is less power consumption and a small power-delay time product of some fJ/gate. However, further improvement of SITL in a low power operation is left to be made. The present invention will be described in conjunction with the structure of the conventional type of SITL shown in FIG. 1.

FIG. 1(a) illustrates a sectional structure of a so-called planar-gate type SITL and FIG. 1(b) illustrates an equivalent circuit diagram thereof. A lateral PNP bipolar junction transistor (BJT) $T_1$ composed of a P+ injector region 15, a n− base region 13a and a collector region which also acts as a P+ gate region 14 of a SIT, operates as the load element or injector transistor, and a vertical SIT $T_2$ composed of the P+ gate region 14, a n− channel region 13, a n+ source region 12 and a n+ drain region 11, operates as a driving transistor. Then, these two transistors are wired to form an inverter circuit similar to $I^2$. In this case, the n+ source region 12 is formed in the same region as the base electrode region fo the lateral BJT $T_1$. When a supplied d.c. voltage is applied through an emitter electrode 5 to the device, the effectiveness of the supplied current depends almost entirely upon a hole transport factor $\alpha$ of the lateral BJT $T_1$.

The hole transported factor $\alpha$ is reduced mainly by the recombination of holes injected from the p+ injector region 15 in the n− regions 13a, 13b and the n+ source region 12, in the boundaries thereof, and in the surface of n− region 13a. Moreover, even if the holes reach the P+ gate region 14, the drivability or operation speed of the SIT is lowered because of an ineffective component of the gate current which does not serve to operate the SIT. The ineffective gate current is caused mainly by holes being injected into the n− region 13 being just under the p+ gate region 14.

In FIG. 2, another example of the conventional SITL is illustrated, which has a lateral MOS FET (or SIT) as a load. FIG. 2(a) illustrates a sectional view thereof and FIG. 2(b) illustrates an equivalent circuit diagram thereof. A lateral MOS.FET $T_1$ is used as a load, which composed of a P+ injector region 15 acting as a source, a P+ gate region 14 acting as a drain, a gate metal electrode 6, an oxide film as a gate insulator and a n− region 13a. On the surface of the n− region 13a, the channel is formed during device operation. In this case, the amount of ineffective current will be reduced since the load $T_1$ is a majority carrier device. However, as shown in FIG. 2(b), BJT $T_{1b}$ is also structurally involved so that almost all holes injected from the bottom portion of the P+ injector region 15 will contribute to an ineffective current. Furthermore, as illustrated in FIG. 1, the static current is always flowing as long as the voltage a power source is being applied even if the switching operation is stopped. As a result, ineffective current accounts for the most part of current consumption in the logic circuit that maintains a static state and seldom switches, such as in a logic circuit for an electronic watch. The example shown in FIG. 2 is also structurally the same.

SUMMARY OF THE INVENTION

The present invention is made to improve the above described drawbacks of the conventional SITL, and provide a structure and fabricating method thereof, in which an ineffective current can be remarkably reduced. As a result, operation with lower power consumption can be realized, and the application of SITL to the IC for an electronic timepiece can be obtained with further reduced current consumption.

One object of the present invention is to extremely reduce the current injection into the unnecessary portion in the operation of the load transistor by means of the formation of insulation film.

Another object of the present invention is to easily fabricate the device by forming a single crystal or polycrystal layer on the insulation film and forming the load transistor therein.

Still another object of the present invention is to provide a logic circuit, in which both driving and load transistors are operated in a switching mode in order to reduce the steady-state current.

BRIEF DESCRIPTION OF THE DRAWINGS

FIGS. 3(a) and 3(b) are sectional views showing a SITL structure of the present invention, respectively.

DETAILED DESCRIPTION OF THE PREFERRED EMBODIMENT

The present invention will be hereinafter described in conjunction with the drawings.

Figure 3A:
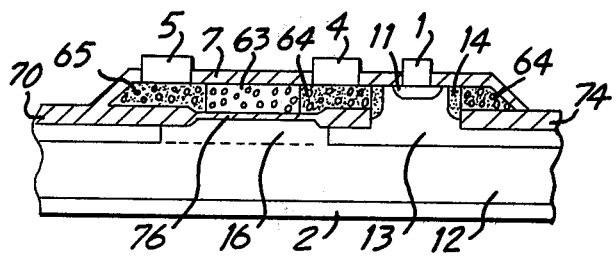
Figure 3C:
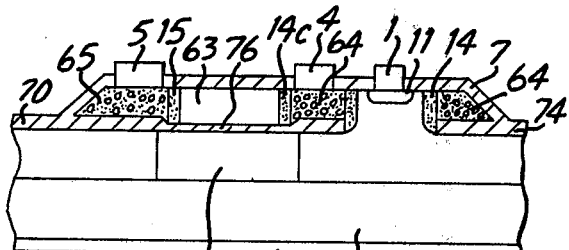
FIG. 3(c) is an equivalent circuit diagram for FIG. 3(b).
Figure 3C:
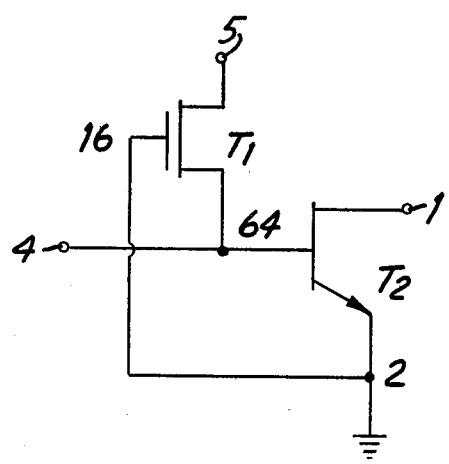

FIG. 3 illustrates an example of the SITL structure of the present invention. FIGS. 3(a) and 3(b) are sectional views thereof and FIG. 3(c) is an equivalent circuit diagram thereof. In FIG. 3(a), the vertical type SIT $T_2$ is a driving transistor which is composed of a n+ source region 12, a n− channel region 13, a single n+ drain region 11, a P+ gate polycrystal region 64 and a P+ gate single crystal region 14 which is formed by the diffusion into the n− channel region 13 from the P+ polycrystal region 64. Also, the major portion of the lateral MOS transistor $T_1$ used as a load transistor or an injector transistor, is made of polycrystal film, and the transistor $T_1$ is composed of a source region being P+ injector polycrystal region 65, a drain region being P+ gate polycrystal region 64, n type polycrystal region 63 wherein a channel is formed, a gate insulation film and a gate electrode 16 of n+ region formed in the substrate side. In the example of FIG. 3(a), the load transistor $T_1$ is isolated from the single crystal region by the use of the insulation films 70, 74 and 76, and channel is formed in n type polycrystal region 63 close to the insulation film 76 by the application of the voltage to the gate electrode 16. The equivalent circuit diagram thereof is illustated in FIG. 3(c).

Figure 1A:
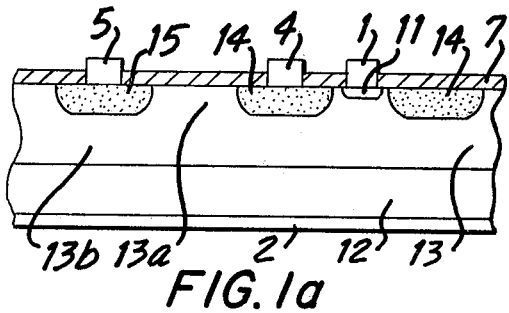
FIG. 1(a) illustrates a sectional view of the conventional SITL.
Figure 1B:
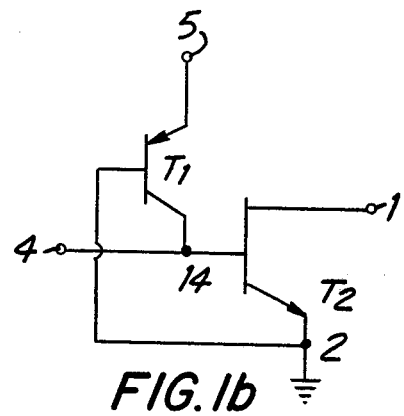
FIG. 1(b) illustrates an equivalent circuit diagram thereof.
Figure 2A:
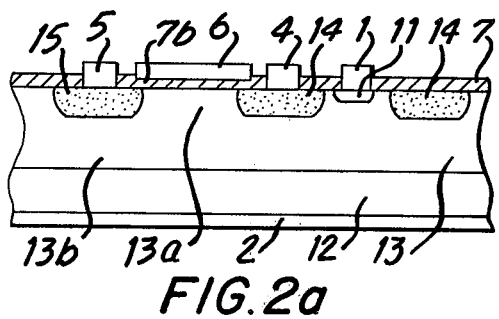
FIG. 2(a) illustrates a sectional view of the conventional SITL wherein a MOS transistor is used as a load.
Figure 2B:
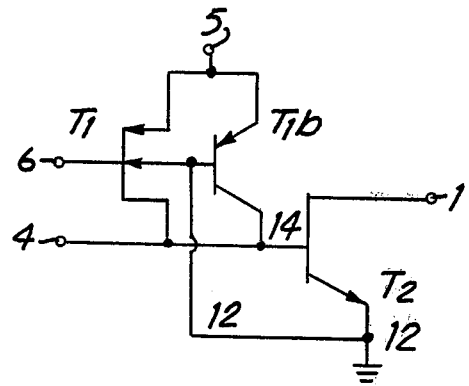
FIG. 2(b) illustrates an equivalent circuit diagram thereof.

Although the MIS transistor $T_1$ does not always have excellent characteristics it is sufficient for a load element. The current therein can be extremely effectively used since the ineffective d.c. current does not flow into the n+ source region 12. In addition, it is not always necessary that the gate electrode 16 be projected from the n+ source region 12 that is, the gate insulation film 76 can be formed directly on the n− region 13, on the n+ source region 12, or on the n+ gate electrode 16 burried in the n− region 13. FIG. 3(b) shows a preferred example, in which at least the channel of the load transistor $T_1$ is formed by the use of n type single crystal region 63. The example shown in FIG. 3 is advantageous when the device is fabricated in the form of an integrated circuit, since it is not necessary to provide a gate electrode on the surface, such as, the gate electrode 6 of the conventional load transistor shown in FIG. 2. And furthermore, this is advantageous in that it is unnecessary to connect the gate electrode 6 to the n+ source region 12 using a wiring metal in order to realize the circuit structure similar to that of FIG. 3(c). More advantageously, there is no BJT operation in the present invention. In the structure of FIG. 3(a) or FIG. 3(b), for utilizing a MOS field effect transistor, at least the thickness between 100 and 1000 [Å] is sufficient for the thickness of the polycrystal film for forming load transistor $T_1$, and as will be hereinafter described, the fabrication may be more easily done. Moreover, it is advantageous for achieving a higher speed operation due to the reduction of a capacitance in the SIT $T_2$ and the reduction of a channel length (or base width in appearance).

FIG. 4 illustrates another structural example of the present invention. The embodiment shown in FIG. 4(a) is a BJT wherein a load transistor is formed within a polycrystal region. In this device, a n+ base polycrystal region 66 is formed on the surface of n type base polycrystal region 63 and a lateral BJT is isolated from n+ source region 12 of the SIT by the use of insulation film 74. FIG. 4(b) is an example of a load MOS transistor wherein a gate electrode 6 is formed on the surface thereof through a gate insulation film 76, and the equivalent circuit diagrams is illustrated in FIG. 4(c). Due to the presence of the insulation layer 74, this device is different from the device of FIG. 2(b) in that no parastic BJT is formed and then ineffective current is reduced. The equivalent circuit for FIG. 4(a) will be obtained by replacing the load $T_1$ of FIG. 4(c) by a BJT. As in well as the case of FIG. 3(b), a single crystal is also employed in place of these polycrystal layers.

Figure 4A:
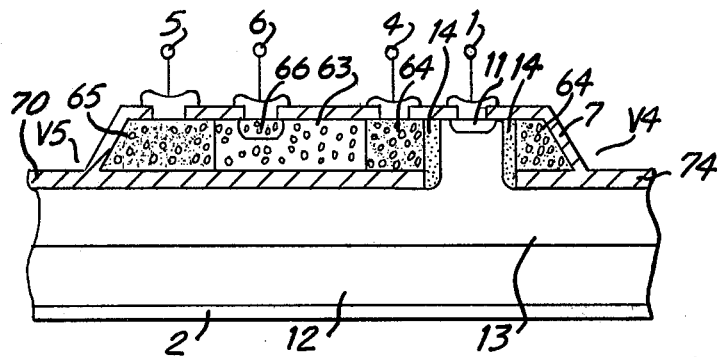
FIGS. 4(a) and 4(b) illustrate sectional views showing another SITL structure of the present invention, respectively.
Figure 4B:
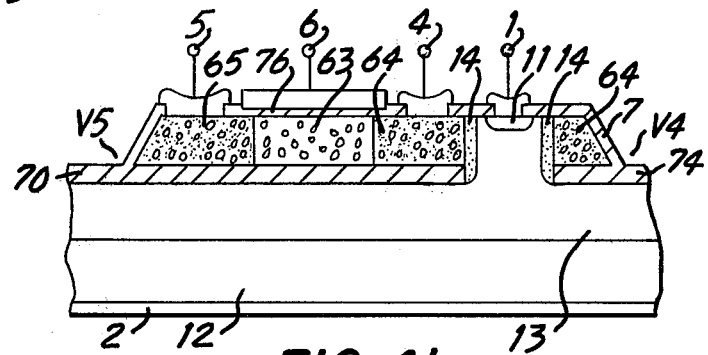
Figure 4C:
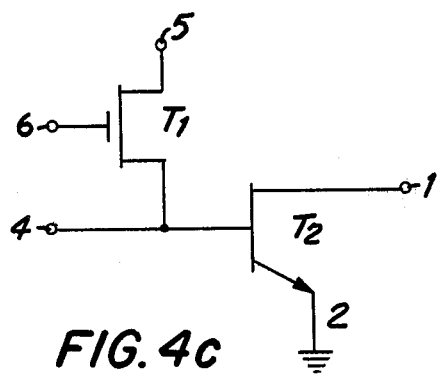
FIG. 4(c) is an equivalent circuit diagram for FIG. 4(b) and FIG. 4(d) is a view showing an example of an application of the invention to a circuit.
Figure 4D:
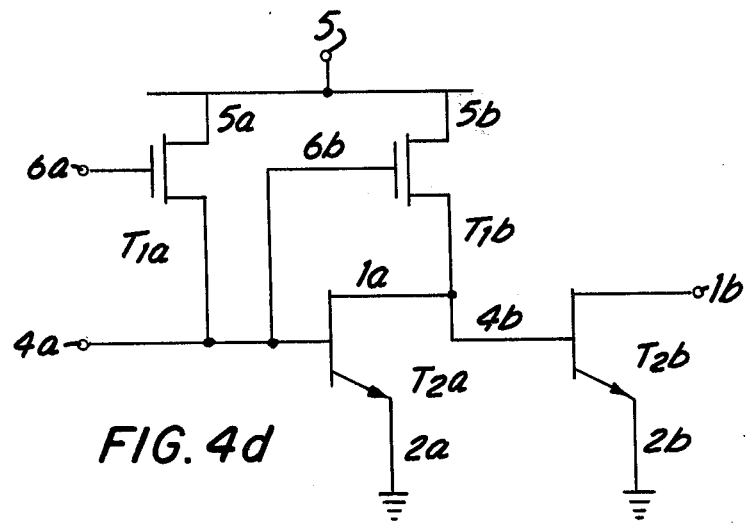

In order to reduce the consumption of current, a circuit form illustrated in FIG. 4(c) for the structure of FIG. 4(a) and FIG. 4(b), is preferably used. That is, when connecting among the first SITL stage composed of a load transistor $T_{1a}$ and a driving SIT $T_{2a}$ and the second SITL stage composed of a load transistor $T_{1b}$ and a driving SIT $T_{2b}$, a control electrode 6b of load transistor $T_{1b}$ of the second stage is connected to a gate electrode 4a of driving SIT $T_{2a}$ of the first stage to apply an input signal to both the control electrode 6b and the gate electrode 4a. Due to this connection, when output resistance of the SIT $T_{2a}$ is low and output resistance of the transistor $T_{1b}$ is high at application of an ON signal to the input terminal (gate electrode) 4a, the output voltage derived from a drain terminal 1a is sufficiently low, and then through current can be limited by the output resistance of the transistor $T_{1b}$. On the other hand, since the SIT $T_{2a}$ has a higher output resistance and the load transistor $T_{1b}$ has a lower output resistance when an OFF signal is applied to a gate terminal 4a, the potential on the drain output terminal 1a becomes sufficient for driving the SIT $T_{2b}$ in the second stage and the current supplied from a power source (injector) terminal. In this circuit structure in FIG. 4(d), the capacitance transistor $T_{1b}$ is added to the input capacitance of the SIT $T_{2a}$, so the operation speed is lower than that of the conventional SITL. Therefore, this circuit structure is most effective for a low frequency switching operation of the electronic timepiece IC, but the speed of operation is faster than that of the conventional CMOS device because of the small capacitance of the SIT. Although a MIS transistor is used as load transistors $T_{1a}$ and $T_{1b}$ in FIG. 4(d), a BJT, FET or SIT is also usable. The reason why this circuit form is most suitable, is in that there is scarcely few ineffective current from injector terminal 5a and 5b.

Figure 5A:
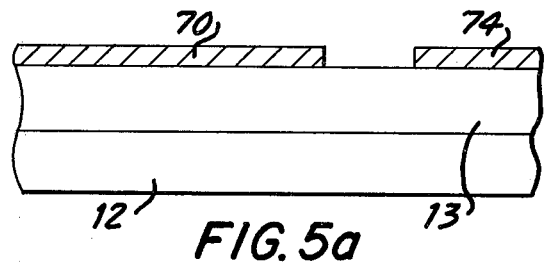
FIGS. 5(a) to 5(e), FIGS. 6(a) to 6(d) and FIGS. 7(a) to 7(d) are sectional views illustrating fabricating steps for the SITL structure of the present invention.

FIGS. 5(a) to 5(e) are sectional views of the structure of SIT of the present invention illustrating fabricating steps. FIG. 5(a) illustrates a sectional view, in which an n− epitaxial layer including the part of n− channel region 13 is deposited on n+ Si substrate as the n+ source region 12, oxide films 70 and 74 are formed on the surface thereof by the technique of CVD or thermal oxidation, and then windows are opened in the oxide film at the portions to be formed as channel in subsequence steps. The impurity density of the n− epitaxial layer is typically $10^{12}$ to $10^{14}$ cm$^{-3}$ and, although the thickness depends upon the purpose, the thickness is typically 0 to 10 μm.

Figure 5B:
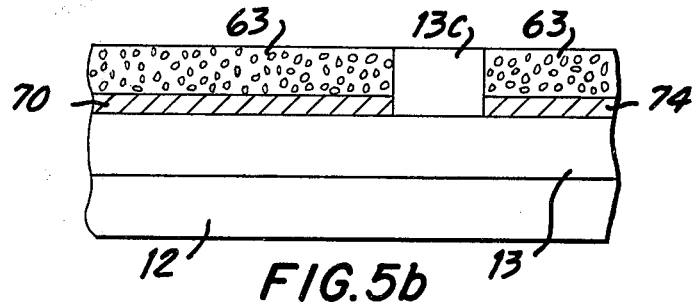
Figure 5C:
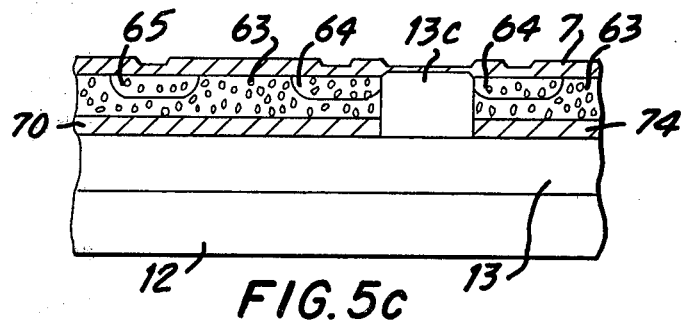
Figure 5D:
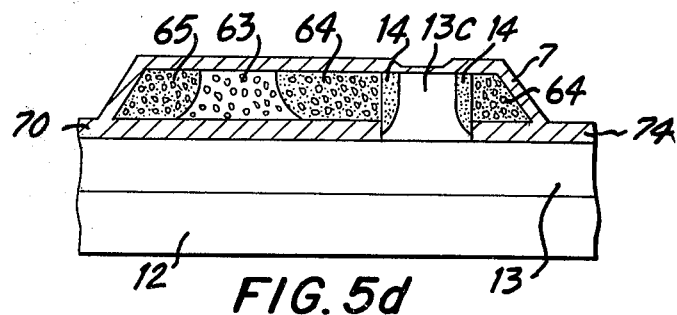
Figure 5E:
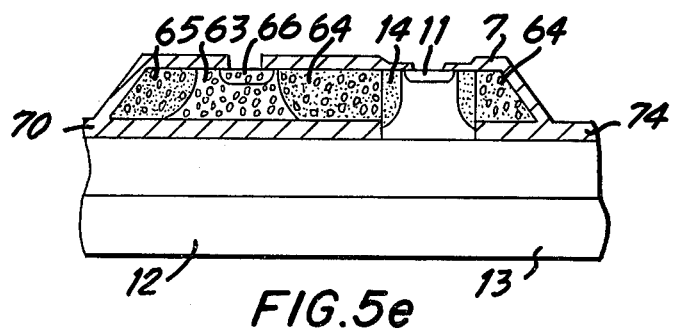

FIG. 5(b) illustrates the sectional view in which n type epitaxial layer 13c is further deposited. A n type Si polycrystal layer 63 is deposited on the oxide films 70 and 74, the thickness thereof is approximately 100 Å to 10 μm and impurity density is typically $10^{12}$ to $10^{15}$ cm$^{-3}$. In FIG. 5(c), oxide film 7 is formed on the surface, and P+ injector region 65 and P+ gate region 64 are formed by selective diffusion. In the step of FIG. 5(d), the Si polycrystal layer 63 is removed around the SITL unit to form isolation regions, and P+ gate region 64 is diffused to form P+ gate single crystal region 14 in n− single crystal layer 13c during the oxidation step. In FIG. 5(e), n+ drain region 11 and n+ base electrode region 66 are formed. As compared with the fabrication steps of conventional SITL, only one step of epitaxial growth is increased in fabricating the SITL of the present invention.

Figure 6A:
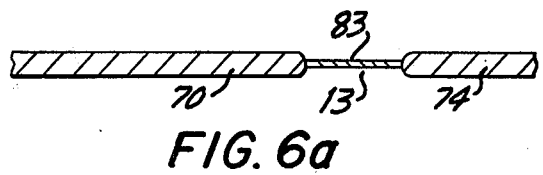
Figure 6B:
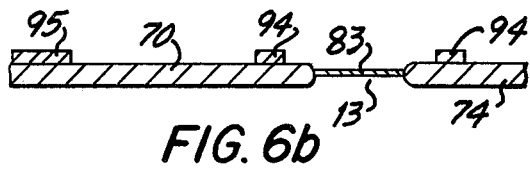
Figure 6C:
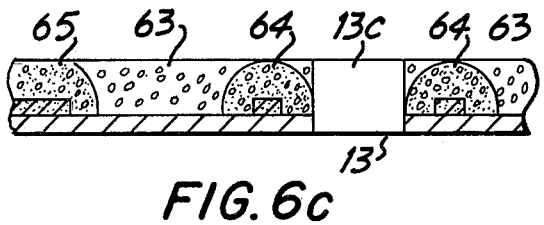
Figure 6D:
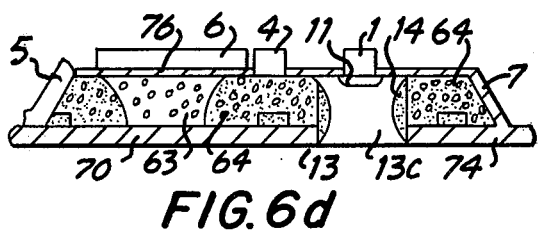

FIGS. 6(a) to 6(d) are sectional views for explaining another fabricating steps of the present invention. To simplify, n+ source region 12 being the n+ Si substrate is omitted. FIG. 6(a) illustrates the sectional view, in which oxide films 70 and 74 are formed on n− channel region 13 by the selective oxidation using nitrided film 83 as a mask. FIG. 6(b) is the sectional view, in which a film containing P type impurity, such as, polycrystal layer or, oxide (for example, boron silicate glass, doped oxide) is deposited and selectively etched to form impurity source films 95 and 94 at the portion of P+ injection region 65 and P+ gate region 64. As illustrated in FIG. 6(c), the epitaxial growth is carried out after removing the nitrided film 83, and then n− single crystal layer 13c is formed on the exposed surface of n− channel region 13. A n type polycrystal layer 63 is deposited on the oxide films 70 and 74. P+ injector region 65 and P+ gate region 64 are formed on impurity source films 95 and 94. At the time, it is preferable to subject to epitaxial growth by the CVD of $SiH_4$ or $SiH_2Cl_2$ with less autodope under the condition of low temperature, such as, a temperature range between 850° C. and 1050° C. A molecular beam deposition method is also effective for this epitaxial growth. After this, as illustrated in FIG. 6(d), n+ drain region 11, gate electrode 6 of the lateral MOS transistor and gate insulation film 76 can be formed by employing usual steps. According to this steps, the selective diffusion using impurity source films 94 and 95 and epitaxial growth can be carried out at the same time, and P+ gate region 14 of the SIT can be formed in small sizes and apart from n+ drain region 11 on the surface since impurity source films 94 and 95 are not on the polycrystal film 63 but beneath the film 63.

Figure 7A:
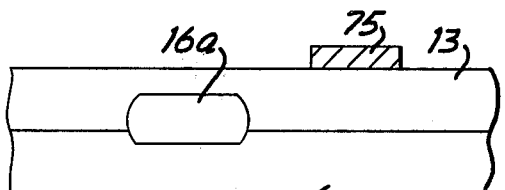
Figure 7B:
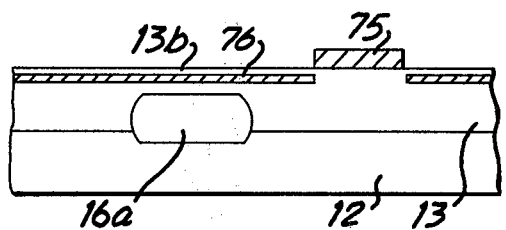
Figure 7C:
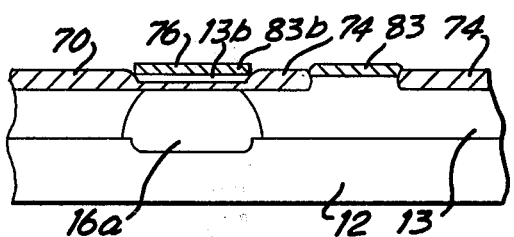

FIGS. 7(a) to 7(d) illustrate another example of fabricating steps of the present invention. FIG. 7(a) is the sectional view, in which n− channel region 13 is formed by an epitaxial growth technique on n+ Si substrate being the n+ source region 12, and at the same time, n+ buried layer 16a is formed. Furthermore, a masking film 75 (such as, oxide or, metal) for ion implantation is deposited on the portion where the SIT channel region will be formed later. In FIG. 7(b), a lot of oxygen or nitrogen ions are deeply implanted to form the insulating film 76, such as oxide film. FIG. 7(c) is the sectional view, in which nitride films 83 and 83b are formed by deposition on the portions of SIT channel region and current path of the lateral load transistor (in this case, channel of a MIS transistor), and then oxide films 70 and 74 are formed by a selective oxidation so as to reach the inner oxide film 76.

Figure 7D:
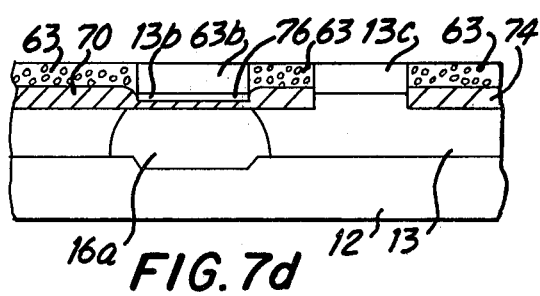

In the present invention, the selective oxidation step is not always necessary, however, it is preferable for the reduction of capacitance and for the effective use of the insulation film 76 as a gate insulation film. FIG. 7(d) is the sectional view, in which single crystal layers 13c and 13b are deposited on the portion of main current path the SIT and lateral transistor, and polycrystal layer 63 is formed on the other portion, after removing the nitriding films 83 and 83b. After this, the structure shown in FIG. 3(b) can be realized by carrying out the usual steps,.

As described above, according to the fabricating method of the present invention, a single crystal layer and polycrystal layer can be formed by one epitaxial growth step and the SIT or load transistor can be formed in each region. Moreover, as the portion which should be subjected to P type selective diffusion is a polycrystal layer, the deep diffusion can be performed even under the low temperature condition within a short time so that the fabrication can be advantageously carried out even for scale-reduced devices.

Figure 8:
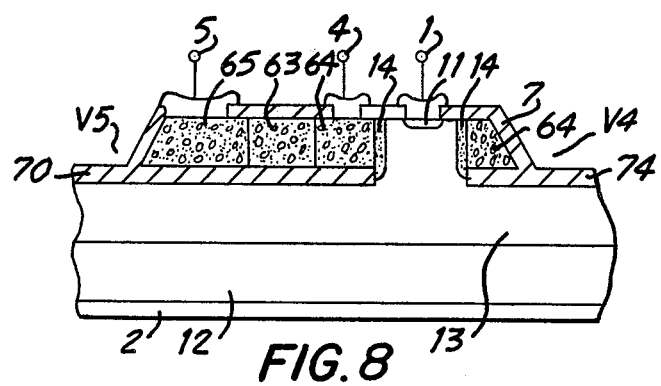
FIG. 8 illustrates a sectional view of another structure of the present invention.

From the foregoing description, the gist of the present invention has now made clear, and it is clear that the present invention is also applicable to a logic circuit wherein a field effect transistor, such as, normal junction type FET and the like, or the BJT other than the SIT is used as a driving transistor and that the conductivity type of each region can be reversed. The present invention is not limited to the Si semiconductor device, but also applicable to a compound semiconductor, for example, GaAs. Moreover, the lateral load transistor is not limited to the transistor described above, but, the load may be a resistor of a diode, an example of which is illustrated in FIG. 8. In this example, a low impurity density region a low impurity density region 63 is easily formed between P+ gate region 64 and P+ injector region 65 of polycrystal layer or single crystal layer. Even if such a structure is employed, the reduction of ineffective current, which is a major effect of the present invention, can be achieved.

As described above, the present invention has a wide application field, however, the present invention is more effective in the case that it is applied to the integrated circuit which must be operated by a dry battery for a long time, such as, an integrated circuit for an electronic timepiece wherein an effective use of current must be maintained.

What is claimed:

1. An integrated logic circuit device including a first unit logic circuit comprising a lateral load transistor and a vertical static induction driving transistor, wherein said static induction transistor comprises a first semiconductor region of a first conductivity type with a high impurity concentration, a second semiconductor region of the first conductivity type with a low impurity concentration and disposed on and adjacent to said first region and defining a channel region of said static induction transistor, a third semiconductor region of the first conductivity with a high impurity concentration disposed on and adjacent to said second region, and a fourth semiconductor region defining a gate region of a second conductivity type opposite to said first conductivity type and surrounding a side portion of said channel region defined by said second semiconductor region to control the current between said first and said third regions, and said lateral transistor comprises an insulating film overlying a portion of said first region extending thereunder, a fifth semiconductor region of said second conductivity type disposed on said insulating film and defining an injector, a sixth semiconductor region having a low impurity concentration and disposed adjacent to said fifth region and on said insulating film and defining a channel region of said lateral transistor, and a seventh semiconductor region comprised of a portion of said fourth region adjacent to said sixth region and at least partially disposed on said insulating film, said lateral transistor comprising an insulating gate field effect transistor comprised of said fifth, said sixth, and said seventh regions, a second insulating film disposed on the surface of said sixth region of said first conductivity type and defining a gate insulator, and a gate electrode on said second insulating film; and a second unit logic circuit wherein said gate electrode of said lateral transistor and said fourth region of said static induction transistor are respectively wired to a gate region and a drain region of a static induction transistor as a driving transistor of said second unit logic circuit, said second unit logic circuit comprising a lateral transistor and a static induction transistor.

* * * * *